US008716596B1

(12) United States Patent
Swanson

(10) Patent No.: US 8,716,596 B1
(45) Date of Patent: *May 6, 2014

(54) SOLAR CELL HAVING SILICON NANO-PARTICLE EMITTER

(75) Inventor: Richard M. Swanson, Los Altos Hills, CA (US)

(73) Assignee: SunPower Corporation, San Diego, CA (US)

( * ) Notice: Subject to any disclaimer, the term of this patent is extended or adjusted under 35 U.S.C. 154(b) by 42 days.

This patent is subject to a terminal disclaimer.

(21) Appl. No.: 12/699,327

(22) Filed: Feb. 3, 2010

Related U.S. Application Data

(63) Continuation of application No. 11/563,548, filed on Nov. 27, 2006, now Pat. No. 7,705,237.

(51) Int. Cl.
*H01L 31/028* (2006.01)

(52) U.S. Cl.
USPC ............. 136/258; 136/246; 136/261; 438/97; 438/96; 438/83

(58) Field of Classification Search
None
See application file for complete search history.

(56) References Cited

U.S. PATENT DOCUMENTS

| 4,072,541 | A | * | 2/1978 | Meulenberg et al. ......... 136/255 |
| 5,057,439 | A | * | 10/1991 | Swanson et al. ................ 438/98 |
| 5,907,766 | A | * | 5/1999 | Swanson et al. ................ 438/72 |
| 6,153,823 | A | * | 11/2000 | Shiozaki et al. .............. 136/249 |
| 6,872,321 | B2 | | 3/2005 | Thavarajah et al. |
| 7,705,237 | B2 | * | 4/2010 | Swanson ....................... 136/261 |
| 2004/0200520 | A1 | * | 10/2004 | Mulligan et al. .............. 136/256 |
| 2005/0155641 | A1 | | 7/2005 | Fafard |
| 2006/0130891 | A1 | * | 6/2006 | Carlson ......................... 136/256 |
| 2007/0023082 | A1 | | 2/2007 | Manivannan et al. |
| 2007/0151599 | A1 | | 7/2007 | Cousins |
| 2007/0232028 | A1 | | 10/2007 | Lee et al. |
| 2007/0256728 | A1 | | 11/2007 | Cousins |

OTHER PUBLICATIONS

Nayfeh et al., Thin Film siliocn Nanoparticle UV Photodetector, Photonics Technoloty Letters, vol. 16, No. 8, pp. 1927-1929, 2004.*
O.M. Nayfeh, et al. "Thin Film Silicon Nanoparticle UV Photodetector", Aug. 2004, pp. 1927-1929, IEEE Photonics Technology Letters, vol. 16, No. 8.

\* cited by examiner

*Primary Examiner* — Jennifer K. Michener
*Assistant Examiner* — Jayne Mershon
(74) *Attorney, Agent, or Firm* — Okamoto & Benedicto LLP

(57) ABSTRACT

A silicon solar cell having a silicon substrate includes p-type and n-type emitters on a surface of the substrate, the emitters being doped nano-particles of silicon. To reduce high interface recombination at the substrate surface, the nano-particle emitters are preferably formed over a thin interfacial tunnel oxide layer on the surface of the substrate.

7 Claims, 1 Drawing Sheet

SOLAR CELL HAVING SILICON NANO-PARTICLE EMITTER

CROSS-REFERENCE TO RELATED APPLICATION(S)

This application is a continuation of pending U.S. patent application Ser. No. 11/563,548, filed Nov. 27, 2006, the disclosure of which is hereby incorporated by reference.

BACKGROUND OF THE INVENTION

This invention relates generally to photovoltaic solar cells, and more particularly the invention relates to a solar cell employing silicon nano-particle emitters.

The use of photovoltaic cells for the direct conversion of solar radiation into electrical energy is well known, see Swanson, U.S. Pat. No. 4,234,352 for example. Briefly, the photovoltaic cell comprises a substrate of semiconductive material having a p-n junction defined therein. In the planar silicon cell the p-n junction is formed near a surface of the substrate which receives impinging radiation. Radiated photons create mobile carriers (holes and electrons) and the substrate which can be directed to an electrical circuit outside of the cell. Only photons having at least a minimum energy level (e.g., 1.1 electron volt for silicon) can generate an electron-hole pair in the semiconductor pair. Photons having less energy are either not absorbed or are absorbed as heat, and the excess energy of photons having more than 1.1 electron volt energy (e.g. photons have a wavelength of 1.1 μm and less) create heat. These and other losses limit the efficiency of silicon photovoltaic cells in directly converting solar energy to electricity to less than 30%.

Solar cells with interdigitated contacts of opposite polarity on the back surface of the cell are known and have numerous advantages over conventional solar cells with front side metal grids and blanket or grid metallized backside contacts, including improved photo-generation due to elimination of front grid shading, much reduced grid series resistance, and improved "blue" photo-response since heavy front surface doping is not required to minimize front contact resistance because there are no front contacts. In addition to the performance advantages, the back-contact cell structure allows simplified module assembly due to coplanar contacts. See Swanson U.S. Pat. No. 4,927,770 for example.

In order to improve the efficiency of silicon solar cells, the use of hetero-junction carrier emitters has been studied. Heretofore, only amorphous silicon has demonstrated good hetero junction properties, particularly in providing minority carrier blocking toward holes and good electrical contact between electrons in a silicon substrate and the contact material for low contact resistance. For a high performance cell, both n-type and p-type hetero junction emitters are required.

SUMMARY OF THE INVENTION

In accordance with the invention, carrier emitters in a solar cell comprise nano-particle silicon preferably having particle size of less than twenty nanometers in diameter.

Minority carrier blocking property of a contact can be obtained by using a semiconductor with a larger band-gap than silicon in a solar cell substrate, and when silicon particles are in the range of less than twenty nanometers, the bandgap of the particles increases due to quantum confinement.

The nano-particle silicon can be prepared in solution, either doped or undoped, for deposition on a silicon substrate. The deposited particles can be stabilized with surfactants to prevent particle agglomeration or clustering on the substrate surface.

If needed, the interface recombination of the nano-particles can be further reduced by forming a thin interfacial silicon oxide layer or tunnel oxide on the substrate surface prior to particle deposition.

The invention and object and features thereof will be more readily apparent from the following detailed description and appended claims when taken with the drawings.

DETAILED DESCRIPTION OF ILLUSTRATIVE EMBODIMENTS

Figure 1:
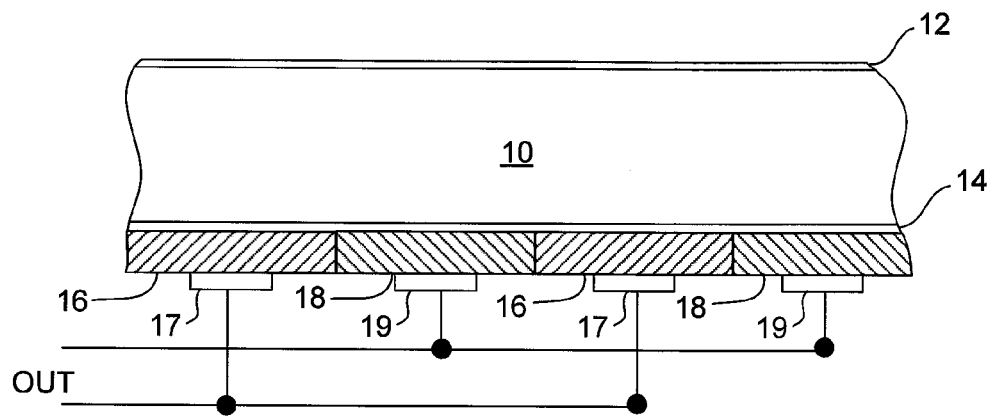
FIG. 1 is a section view of a solar cell with nano-particle silicon emitters in accordance with an embodiment of the invention.

FIG. 1 illustrates in section view one embodiment of a solar cell in accordance with the invention. As in the conventional silicon solar cell, the cell comprises a polysilicon or single crystalline silicon substrate 10 with a thickness on the order of 200 microns and which can be either undoped or lightly doped (e.g. 5 ohm-centimeter). A passivation layer 12 is formed on the front surface of the substrate which can be textured by anisotropic texturing for example, prior to formation of the passivation layer. The passivation layer can be a thin silicon oxide layer which is grown simultaneously with a high quality tunnel oxide layer 14 on the bottom or back surface of substrate 10. The top passivation layer 12 can be coated with an anti-reflective coating such as silicon nitride or doped silicon carbide (not shown) as in conventional processing.

The back surface of substrate 10 includes alternating p-emitters 16 and n-emitters 18 which are formed by deposition over tunnel oxide 14. In accordance with the invention, p-type emitters 16 and n-type emitters 18 are formed of nano-particle silicon having diameters preferably of less than 20 nanometers. As noted above, when silicon particles are small enough, the band-gap of the particles increases due to quantum confinement. The presence of the thin interfacial tunnel oxide layer 14 mitigates any high interface recombination at the single crystal surface of substrate 10. Tunneling through the oxide into the nano-particles is not a problem since the band-gap is larger than the substrate. Consequently, the oxide need only be thick enough to passivate any dangling bonds from the emitters. Metal contacts 17 and 19 are made to emitters 16 and 18, respectively.

Figure 2:
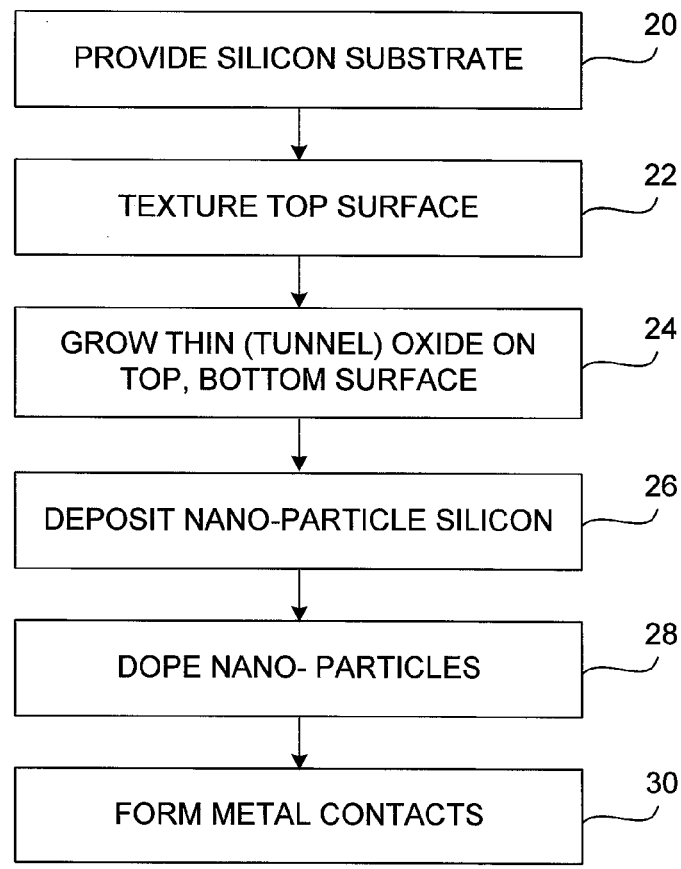
FIG. 2 is flow diagram illustrating fabrication of the solar cell of FIG. 1.

FIG. 2 is a flow diagram illustrating steps in fabricating the silicon solar cell of FIG. 1. Initially, a silicon substrate is provided at 20, the substrate being either single crystalline or polycrystalline. The top surface can be textured such as by anisotropic etching while the bottom surface is polished at 22, and then a thin tunnel oxide is grown on the top and bottom surfaces at 24. As noted above, the thin interfacial oxide layer or tunnel oxide mitigates against high interface recombination at the single crystal surface.

Thereafter, as shown in 26, a layer of nano-particle silicon is formed on the bottom surface of the substrate. To prevent agglomeration or clustering of the particles, a surfactant can be applied to the surface along with the nano-particles which enhances single particle deposition. The nano-particles are readily fabricated using known processing such as described by Kortshagen et al. "Plasma Synthesis of Single Crystal Nanoparticles for Novel Electronic Device Applications", downloaded from http://arxiv.org/ftp/physics/papers/0410/0410038.pdf, dated Oct. 5, 2004. Alternatively, the nanoparticles are available in solution from Reade Electronic Materials along with a surfactant to prevent particle clustering. The particles in solution can be doped or undoped. Application to the substrate can be by screen processing, inkjet printing, or by spin on. Following deposition of the nanoparticles, dopants are introduced selectively for forming the p-type nano-particle emitters 16 and the n-type nano-particle emitters 18 as shown in FIG. 1, if the particles are not already doped. The solar cell is then completed by forming metal contacts for selectively interconnecting the p-type emitters and the n-type emitters on the back surface of the solar cell as shown at 17, 19 in FIG. 1. The contacts and connection are formed by first sputtering a seed layer of a conductive metal such as aluminum or copper and then pattern plating the seed metal to increase thickness. Alternatively, the seed layer can be applied by inkjet.

The use of doped nano-particles of silicon as emitters in a silicon solar cell in accordance with the invention is readily fabricated and provides a high performance cell without the need for a hetero junction interface at the emitters and substrate.

While the invention has been described with reference to specific embodiments, the description is illustrative of the invention and is not to be construed as limiting the invention. Various applications and modifications may occur to those skilled in the art without departing from the spirit and scope of the invention as defined by the appended claims.

What is claimed is:

1. A silicon solar cell comprising:
   a) a silicon substrate having first and second opposing major surfaces, wherein the first major surface is on a side of the solar cell which is configured to be disposed toward sunlight for creation of mobile carriers in the silicon substrate;
   b) a thin interfacial passivation layer on the second major surface, wherein the thin interfacial passivation layer comprises a tunnel oxide layer; and
   c) a plurality of emitters formed from doped silicon nanoparticles, wherein the plurality of emitters are formed on the thin interfacial passivation layer on the second major surface, wherein the tunnel oxide layer is continuous under each emitter of the plurality of emitters.

2. The silicon solar cell of claim 1 wherein the substrate is polycrystalline silicon.

3. The silicon solar cell of claim 1 wherein the substrate is single crystalline silicon.

4. The silicon solar cell of claim 3 wherein the substrate is undoped.

5. The silicon solar cell of claim 3 wherein the substrate is lightly doped.

6. The silicon solar cell of claim 5 wherein the nanoparticles of the emitters have a diameter of less than 20 nanometers.

7. The silicon solar cell of claim 1, wherein the thin interfacial passivation layer covers the second major surface.

* * * * *